United States Patent
Watanabe

(10) Patent No.: US 9,543,924 B2
(45) Date of Patent: Jan. 10, 2017

(54) LADDER SURFACE ACOUSTIC WAVE FILTER

(71) Applicant: Murata Manufacturing Co., Ltd., Nagaokakyo-shi, Kyoto-fu (JP)

(72) Inventor: Kazushi Watanabe, Nagaokakyo (JP)

(73) Assignee: Murata Manufacturing Co., Lt., Kyoto (JP)

( * ) Notice: Subject to any disclaimer, the term of this patent is extended or adjusted under 35 U.S.C. 154(b) by 120 days.

(21) Appl. No.: 14/510,237

(22) Filed: Oct. 9, 2014

(65) Prior Publication Data
US 2015/0022283 A1  Jan. 22, 2015

Related U.S. Application Data

(63) Continuation of application No. PCT/JP2013/060754, filed on Apr. 9, 2013.

(30) Foreign Application Priority Data

Apr. 10, 2012  (JP) .................................. 2012-089378

(51) Int. Cl.
*H03H 9/64* (2006.01)
*H03H 9/00* (2006.01)
(Continued)

(52) U.S. Cl.
CPC .......... *H03H 9/6423* (2013.01); *H03H 9/0009* (2013.01); *H03H 9/0557* (2013.01);
(Continued)

(58) Field of Classification Search
CPC ...... H03H 9/64; H03H 9/6423; H03H 9/6483; H03H 9/0557; H03H 9/0009; H03H 9/0514; H03H 9/059; H03H 2001/0085; H01L 2224/16225
(Continued)

(56) References Cited

U.S. PATENT DOCUMENTS

| 7,459,992 B2 * | 12/2008 | Matsuda | H03H 9/568 333/133 |
| 7,554,422 B2 * | 6/2009 | Nakatsuka | H03H 3/02 333/133 |

(Continued)

FOREIGN PATENT DOCUMENTS

| JP | 09-321573 A | * 12/1997 |
| JP | 2001-044792 A | 2/2001 |

(Continued)

OTHER PUBLICATIONS

Official Communication issued in International Patent Application No. PCT/JP2013/060754, mailed on Jun. 25, 2013.

*Primary Examiner* — Barbara Summons
(74) *Attorney, Agent, or Firm* — Keating & Bennett, LLP

(57) ABSTRACT

A ladder surface acoustic wave filter includes a series arm connecting an input terminal and an output terminal, at least one parallel arm connecting the series arm and a ground terminal, at least one series arm resonator provided in the series arm, and at least two parallel arm resonators provided in at least one parallel arm and connected to each other in series. In the ladder surface acoustic wave filter, a connection point between at least the two parallel resonators connected to each other in series is grounded through an inductor.

12 Claims, 11 Drawing Sheets

(51) Int. Cl.
  *H03H 9/05* (2006.01)
  *H03H 1/00* (2006.01)

(52) U.S. Cl.
  CPC ............ *H03H 9/64* (2013.01); *H03H 9/6483* (2013.01); *H01L 2224/16225* (2013.01); *H03H 9/059* (2013.01); *H03H 9/0514* (2013.01); *H03H 2001/0085* (2013.01)

(58) Field of Classification Search
  USPC .......... 333/193–195, 133; 310/313 B, 313 D
  See application file for complete search history.

(56) References Cited

U.S. PATENT DOCUMENTS

| | | | |
|---|---|---|---|
| 7,619,494 B2 * | 11/2009 | Suzuki | H03H 9/568 333/133 |
| 2004/0058664 A1 | 3/2004 | Yamamoto et al. | |
| 2004/0119561 A1 | 6/2004 | Omote | |
| 2005/0110596 A1 | 5/2005 | Yamakawa et al. | |
| 2006/0139125 A1 | 6/2006 | Shiga-ken et al. | |
| 2007/0109073 A1 | 5/2007 | Yamakawa et al. | |
| 2007/0111557 A1 | 5/2007 | Higashiguchi et al. | |
| 2008/0129418 A1 | 6/2008 | Miura et al. | |
| 2010/0188166 A1 | 7/2010 | Hara et al. | |
| 2011/0095844 A1 | 4/2011 | Tanaka et al. | |
| 2012/0313726 A1 | 12/2012 | Ueda et al. | |
| 2013/0214873 A1 | 8/2013 | Takamine | |

FOREIGN PATENT DOCUMENTS

| | | | |
|---|---|---|---|
| JP | 2003-283298 A | | 10/2003 |
| JP | 2004-135322 A | | 4/2004 |
| JP | 2004-173245 A | | 6/2004 |
| JP | 2005-176321 A | | 6/2005 |
| JP | 2005-260833 A | | 9/2005 |
| JP | 2006-100460 A | | 4/2006 |
| JP | 2006-109431 A | * | 4/2006 |
| JP | 2006-333012 A | * | 12/2006 |
| JP | 2008-054046 A | | 3/2008 |
| JP | 2008-109413 A | | 5/2008 |
| JP | 2008-294780 A | | 12/2008 |
| JP | 2010-177770 A | | 8/2010 |
| JP | 2010-192974 A | | 9/2010 |
| JP | 2011-176746 A | | 9/2011 |
| JP | 4905614 B1 | | 3/2012 |
| WO | 2005/055423 A1 | | 6/2005 |
| WO | 2010/004686 A1 | | 1/2010 |

* cited by examiner

COMPARISON OF TRANSMISSION
CHARACTERISTICS
(CHARACTERISTICS IN THE VICINITY
OF PASSBAND)

LADDER SURFACE ACOUSTIC WAVE FILTER

BACKGROUND OF THE INVENTION

1. Field of the Invention

The present invention relates to a ladder surface acoustic wave filter, to be more specific, a ladder surface acoustic wave filter that has desired transmission characteristics and a reduced size.

2. Description of the Related Art

An existing surface acoustic wave filter has been widely used as a filter for a mobile communication device and an intermediate frequency (IF)-stage filter for a television receiver.

Further, as a surface acoustic wave filter with low loss, which has a large pass band and is excellent in selection characteristics, such a ladder surface acoustic wave filter has been known to constitute a ladder filter circuit by alternately arranging a series arm resonator and a parallel arm resonator between an input terminal and an output terminal.

In the ladder surface acoustic wave filter, various efforts have been made in designing a circuit in order to obtain desired transmission characteristics (frequency attenuation characteristics). For example, in the ladder surface acoustic wave filter disclosed Japanese Unexamined Patent Application Publication No. 2004-173245, an inductor is provided between the parallel arm resonator and the ground so as to shift a resonance point of the parallel arm resonator to the low frequency side and form a second resonance point (sub-resonance point) at the high frequency side relative to an anti-resonance point. This enlarges the pass band of the ladder surface acoustic wave filter and forms an attenuation pole in a stop band at the high frequency side relative to the pass band so as to obtain the desired transmission characteristics.

In the above-mentioned existing ladder surface acoustic wave filter, when an inductance value of the inductor that is provided between the parallel arm resonator and the ground is large, there is a problem that the ladder surface acoustic wave filter is increased in size due to the inductor. In particular, when the sub-resonance point of the parallel arm resonator is desired to be formed at the lower frequency side, the inductance value of the inductor that is provided between the parallel arm resonator and the ground needs to be increased in some cases. The increase in the inductance value of the inductor increases the ladder surface acoustic wave filter in size in some cases.

For example, when the inductor that is provided between the parallel arm resonator and the ground is formed on a mounting substrate or a mounting package, the mounting substrate or the mounting package is increased in size, resulting in a problem that the ladder surface acoustic wave filter is increased in size. To be more specific, when the inductor is formed on the mounting substrate having a configuration in which a plurality of ceramic layers are laminated, an inductor electrode formed of a conductive material is arranged between the ceramic layer and the ceramic layer. When an inductor having a large inductance value is required as the inductor that is provided between the parallel arm resonator and the ground, the inductor electrode needs to be long, so that the mounting substrate needs to be made larger in a planar dimension in order to ensure an arrangement space therefor.

Also in the case where the inductor that is provided between the parallel arm resonator and the ground is prepared as a separated inductor component and is mounted on the mounting substrate or the mounting package together with a piezoelectric substrate on which the series arm resonator and the parallel arm resonator are formed, when the inductor having a large inductance value is required as the inductor that is provided between the parallel arm resonator and the ground, a large inductor component needs to be used and a space needs to be ensured on the mounting substrate or the mounting package in order to mount the large inductor component thereon. This results in a problem that the ladder surface acoustic wave filter is increased in size.

SUMMARY OF THE INVENTION

Preferred embodiments of the present invention provide a ladder surface acoustic wave filter that has desired transmission characteristics and a reduced size.

According to a preferred embodiment of the present invention, a ladder surface acoustic wave filter includes a series arm connecting an input terminal and an output terminal, at least one parallel arm connecting the series arm and a ground terminal, at least one series arm resonator located in the series arm, and at least two parallel arm resonators located in at least one parallel arm and connected to each other in series. In the ladder surface acoustic wave filter, at least one connection point between at least the two parallel resonators connected to each other in series is grounded through an inductor.

A ladder surface acoustic wave filter according to the above-described preferred embodiment of the present invention is reduced in size while having desired transmission characteristics.

The ladder surface acoustic wave filter according to the above-described preferred embodiment of the present invention achieves transmission characteristics equivalent to those of an existing ladder surface acoustic wave filter even when an inductance value of an inductor that is provided between a connection point between the parallel arm resonators provided in the parallel arm and connected to each other in series and the ground is made smaller than an inductance value of an inductor that is provided between the parallel arm resonator and the ground in the existing ladder surface acoustic wave filter. With this, in the ladder surface acoustic wave filter according to the above-described preferred embodiment of the present invention, a mounting substrate or a mounting package on which the inductor is provided can be reduced in size or an inductor component that is prepared as a separate component can be reduced in size. This reduces the ladder surface acoustic wave filter in size.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described.

First Preferred Embodiment

Figure 1:
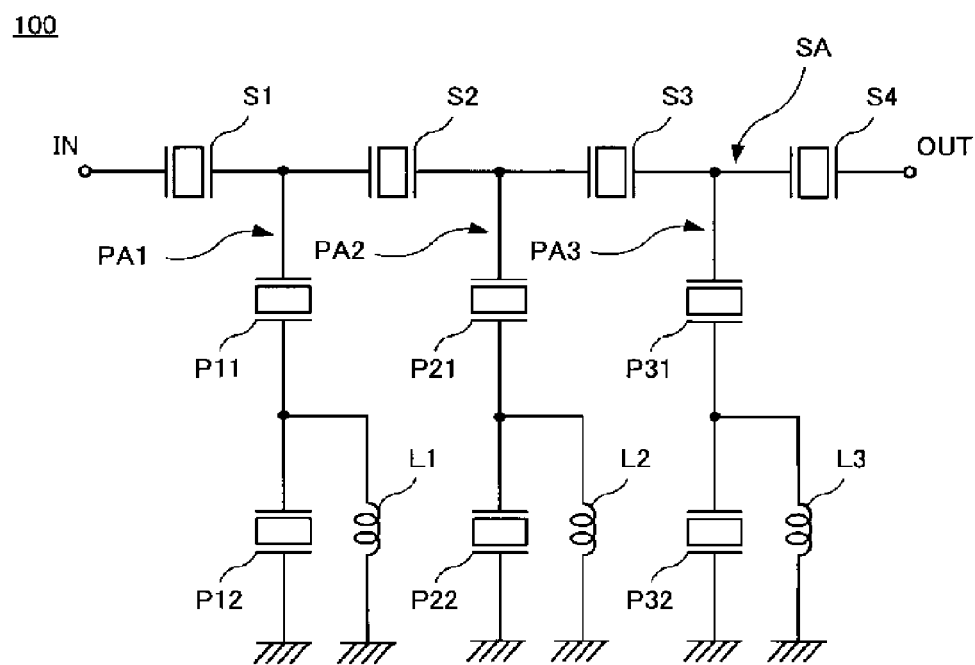
FIG. 1 is a circuit configuration diagram illustrating a ladder surface acoustic wave filter 100 according to a first preferred embodiment of the present invention.
Figure 2:
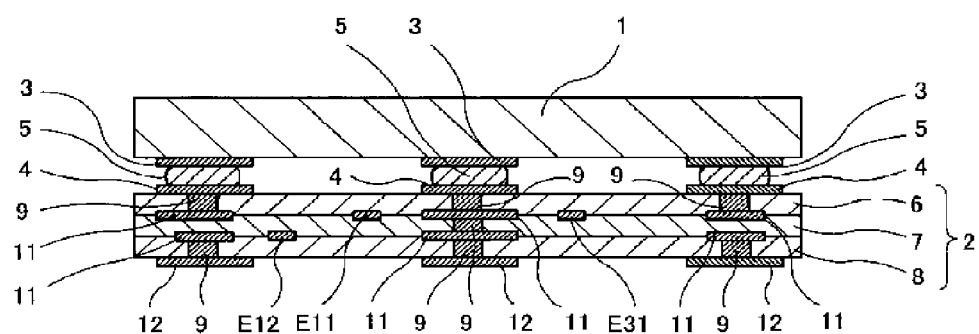
FIG. 2 is a cross-sectional view illustrating the ladder surface acoustic wave filter 100 in the first preferred embodiment of the present invention.

FIG. 1 is a circuit configuration diagram illustrating a ladder surface acoustic wave filter 100 according to a first preferred embodiment of the present invention. FIG. 2 is a cross-sectional view illustrating the ladder surface acoustic wave filter 100. FIGS. 3A-3D are exploded views illustrating a mounting substrate 2 used for the ladder surface acoustic wave filter 100.

As illustrated in FIG. 1, in the ladder surface acoustic wave filter 100, four series arm resonators S1, S2, S3, and S4 connected to one another in series are provided in a series arm SA between an input terminal IN and an output terminal OUT.

A parallel arm resonator P11 and a parallel arm resonator P12 connected to each other in series are provided in a parallel arm PA1 between a connection point between the series arm resonator S1 and the series arm resonator S2 and the ground. A parallel arm resonator P21 and a parallel arm resonator P22 connected to each other in series are provided in a parallel arm PA2 between a connection point between the series arm resonator S2 and the series arm resonator S3 and the ground. A parallel arm resonator P31 and a parallel arm resonator P32 connected to each other in series are provided in a parallel arm PA3 between a connection point between the series arm resonator S3 and the series arm resonator S4 and the ground.

Further, an inductor L1 is provided between a connection point between the parallel arm resonator P11 and the parallel arm resonator P12 and the ground. An inductor L2 is provided between a connection point between the parallel arm resonator P21 and the parallel arm resonator P22 and the ground. An inductor L3 is provided between a connection point between the parallel arm resonator P31 and the parallel arm resonator P32 and the ground.

The respective inductors L1, L2, and L3 have characteristic configurations according to various preferred embodiments of the present invention and have the following functions. First, the inductor L1 shifts a resonance point to the low frequency side in resonation by the parallel arm resonator P11 and the parallel arm resonator P12 and defines a sub-resonance point at the high frequency side relative to an anti-resonance point. The inductor L2 shifts a resonance point to the low frequency side in resonation by the parallel arm resonator P21 and the parallel arm resonator P22 and defines a sub-resonance point at the high frequency side relative to an anti-resonance point. The inductor L3 shifts a resonance point to the low frequency side in resonation by the parallel arm resonator P31 and the parallel arm resonator P32 and defines a sub-resonance point at the high frequency side relative to an anti-resonance point. As a result, as transmission characteristics of the ladder surface acoustic wave filter 100, a pass band is enlarged and an attenuation pole is provided in a stop band at the high frequency side relative to the pass band.

The ladder surface acoustic wave filter 100 according to the first preferred embodiment provides transmission characteristics equivalent to those of an existing ladder surface acoustic wave filter even when the respective inductance values of the inductors L1, L2, and L3 are smaller than an inductance value of an inductor that is provided between a parallel arm resonator and the ground in the existing ladder surface acoustic wave filter. The reason for this will be described below with reference to the drawings.

Figure 4A:
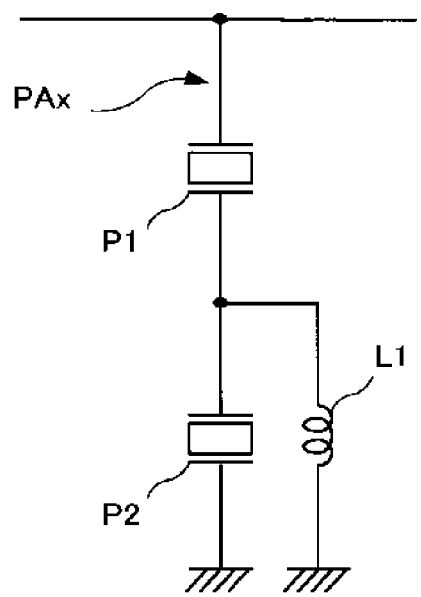
FIG. 4A is a circuit configuration diagram illustrating the configuration of a characteristic parallel arm of the ladder surface acoustic wave filter according to a preferred embodiment of the present invention.
Figure 4B:
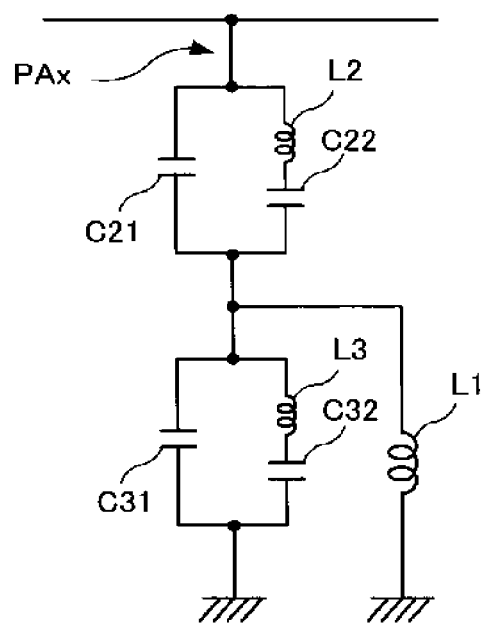
FIG. 4B is an equivalent circuit diagram of FIG. 4A.

FIG. 4A is a circuit configuration diagram of a parallel arm PAX of the ladder surface acoustic wave filter according to a preferred embodiment of the present invention, which is represented by the ladder surface acoustic wave filter 100 in the above-mentioned first preferred embodiment. FIG. 4B is an equivalent circuit diagram of FIG. 4A.

Figure 5A:
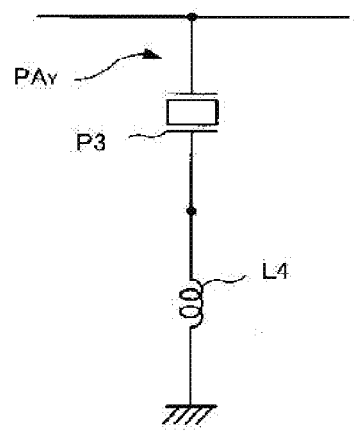
FIG. 5A is a circuit configuration diagram illustrating the configuration of a characteristic parallel arm of an existing ladder surface acoustic wave filter.
Figure 5B:
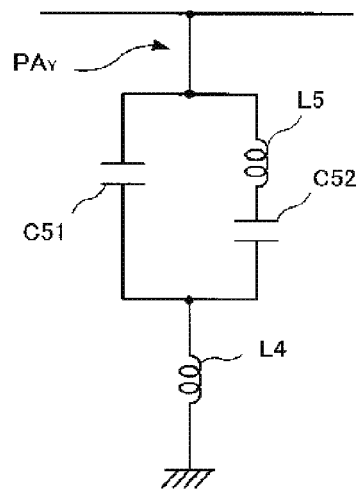
FIG. 5B is an equivalent circuit diagram of FIG. 5A.

Further, as for comparison, FIG. 5A is a circuit configuration diagram of a parallel arm PAY in the existing ladder surface acoustic wave filter and FIG. 5B is an equivalent circuit diagram of FIG. 5A.

The parallel arm PAY of the existing ladder surface acoustic wave filter, which is to be compared with preferred embodiments of the present invention, is configured by inserting an inductor L4 between a parallel arm resonator P3 and the ground, as illustrated in FIG. 5A. The inductor L4 shifts a resonance point of resonation by the parallel arm resonator P3 to the low frequency side and forms a second resonance point (sub-resonance point) at the high frequency side relative to an anti-resonance point.

As illustrated as the equivalent circuit in FIG. 5B, a frequency $f_0$ of the resonance point that is formed by an equivalent inductor L5 of the resonator P3, an equivalent capacitor C51, and the provided inductor L4 is expressed by the following equation approximately.

$$f_0 = 1/\{2\pi\sqrt{((L4+L5) \times C51)}\} \qquad \text{Equation 1}$$

Therefore, the resonance point shifts to the low frequency side by an increment of the inductance value by the provided inductor L4. As illustrated in FIG. 5B, the second resonance point (sub-resonance point) that is formed by the equivalent capacitor C51 of the resonator P3 and the provided inductor L4 is located at the high frequency side relative to the anti-resonance point. Further, the anti-resonance point that is formed by the equivalent capacitor C51 of the resonator P3, the equivalent inductor L5, and an equivalent capacitor C52, does not fluctuate with the provided inductor L4.

That is to say, as illustrated in FIG. 5B, the parallel arm resonator P3 can be expressed as a circuit in which the capacitor C51, and the inductor L5 and the capacitor C52 connected to each other in series are connected in parallel.

In the parallel arm PAY of the existing ladder surface acoustic wave filter, a frequency $f_1$ of the sub-resonance point formed by insertion of the inductor L4 can be expressed by the following equation approximately.

$$f_1 = 1/\{2\pi\sqrt{(L4 \times C51)}\} \qquad \text{Equation 2}$$

On the other hand, as illustrated in FIG. 4A, the parallel arm PAX of the ladder surface acoustic wave filter according to a preferred embodiment of the present invention is preferably configured by providing the inductor L1 between the connection point between the parallel arm resonators P1 and P2 connected to each other in series and the ground. The inductor L1 shifts the resonance point of the resonation by the parallel arm resonators P1 and P2 to the low frequency side and defines the second resonance point (sub-resonance point) at the high frequency side relative to the anti-resonance point. It should be noted the basic characteristics of the resonation by the parallel arm resonators P1 and P2 are defined by constants of the parallel arm resonators P1 and P2.

As illustrated in FIG. 4B, the parallel arm resonator P1 can be expressed as a circuit in which a capacitor C21, and the inductor L2 and a capacitor C22 connected to each other in series are connected in parallel. In addition, the parallel arm resonator P2 can be expressed as a circuit in which a capacitor C31, and the inductor L3 and a capacitor C32 connected to each other in series are connected in parallel.

In the parallel arm PAX of the ladder surface acoustic wave filter according to a preferred embodiment of the present invention, a frequency $f_2$ at the sub-resonance point defined by insertion of the inductor L1 can be expressed by the following equation approximately.

$$f_2 = 1/\{2\pi\sqrt{(L1 \times C21)}\} \qquad \text{Equation 3}$$

In the resonation by the parallel arm resonators P1 and P2 of the ladder surface acoustic wave filter according to a preferred embodiment of the present invention, when the inductance value of L1 is desired to be made smaller while setting the frequency $f_2$ of the sub-resonance point to be equal to the frequency $f_1$ of the sub-resonance point of resonation by the parallel arm resonator P3 in the existing ladder surface acoustic wave filter, it was determined that the capacitance value of C21 should be increased based on the equations of $f_2=f_1$ and $1/\{2\pi\sqrt{(L1 \times C21)}\} = 1/\{2\pi\sqrt{(L4 \times C51)}\}$.

However, the basic characteristics of the resonation by the parallel arm resonators P1 and P2 also change if the capacitance value of C21 is increased only. For avoiding this, in the ladder surface acoustic wave filter in the present preferred embodiment, by adjusting the constants of the parallel arm resonators P1 and P2, the capacitance value of C21 is increased and the inductance value of L1 is decreased while obtaining the same resonance characteristics as those of the parallel arm resonator P3 in the existing ladder surface acoustic wave filter.

For example, in the existing example as illustrated in FIG. 5B, in the case where C51=10 pF and L4=6 nH are satisfied, when the inductance value of L1 is set to 3 nH that is half of the inductance value of L4 according to a preferred embodiment of the present invention as illustrated in FIG. 4B, the capacitance value of C21 is set to 20 pF that is twice as the capacitance value of C51. This causes the basic characteristics of the resonation by the parallel arm resonators P1 and P2 to also change. For solving this, the capacitance value of C31 is preferably set to about 20 pF, so that a total capacitance value CX of C21 and C31 is set to be equal to about 10 pF as the capacitance value of C51, for example. With this, the basic characteristics of the resonation are not changed. That is to say, $CX=(C21 \times C31)/(C21+C31)=(20 \times 20)/(20+20)=10=C51$ is preferably satisfied, for example.

In the above-mentioned method, the capacitance values of the parallel arm resonators P1 and P2, for example, the capacitance values of C21 and C31 need to be adjusted. For adjustment of the capacitance values, it is sufficient that the configurations of interdigital transducer (IDT) electrodes of the resonators provided on the piezoelectric substrate are changed. For example, in order to increase the capacitance values, it is sufficient that the number of pairs of the IDT electrode fingers are increased, the intersecting width of the IDT electrodes is increased, or the distance between the IDT electrodes is decreased. However, when the distance between the IDT electrodes is decreased, other characteristics also change. In order to avoid this, it is desired that the number of pairs of the IDT electrodes is increased, the intersecting width of the IDT electrodes is increased, or both of them are performed.

In this manner, in the ladder surface acoustic wave filter according to a preferred embodiment of the present invention, the resonance characteristics of the respective parallel arms are preferably kept to be equivalent to the existing resonance characteristics although the inductance value of the inductor that is provided between the connection point between the parallel arm resonators provided in the parallel arm and connected to each other in series and the ground is made smaller than the inductance value of the inductor provided between the parallel arm resonator and the ground in the existing ladder surface acoustic wave filter. As a result, in the ladder surface acoustic wave filter according to a preferred embodiment of the present invention, the transmission characteristics equivalent to those in the existing ladder surface acoustic wave filter are obtained although the inductance value of the inductor is made smaller as described above.

The ladder surface acoustic wave filter 100 according to a preferred embodiment of the preferred embodiment is preferably configured by flip-chip-mounting a piezoelectric substrate 1 on the mounting substrate 2, as illustrated in FIG. 2. That is to say, the ladder surface acoustic wave filter 100 according to a preferred embodiment of the present invention is preferably configured by connecting pad electrodes 3 located on the lower surface of the piezoelectric substrate 1 to upper surface electrodes 4 located on the upper surface of the mounting substrate 2 through bumps 5.

Although not illustrated in FIG. 2, the series arm resonators S1, S2, S3, and S4 and parallel arm resonators P11, P12, P21, P22, P31, and P32 are arranged on the lower surface of the piezoelectric substrate 1 so as to be connected to one another based on the above-mentioned relation. Further, predetermined places are connected to the predetermined pad electrodes 3.

Figure 3A:
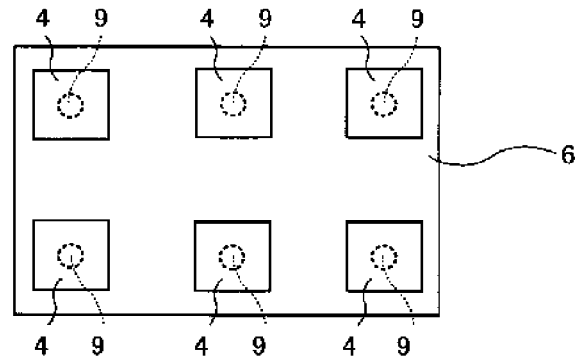
FIGS. 3A-3D are exploded views illustrating a mounting substrate 2 used for the ladder surface acoustic wave filter 100 in the first preferred embodiment of the present invention.
Figure 3B:
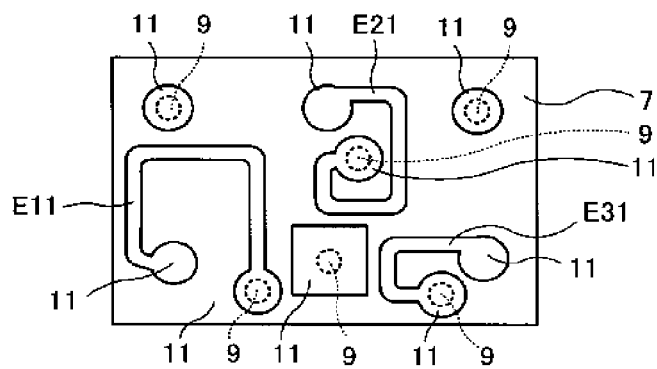
Figure 3C:
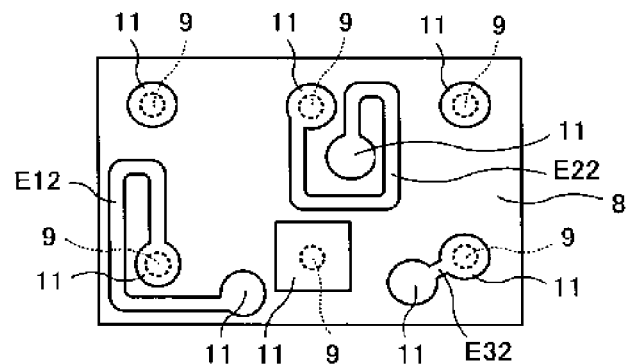
Figure 3D:
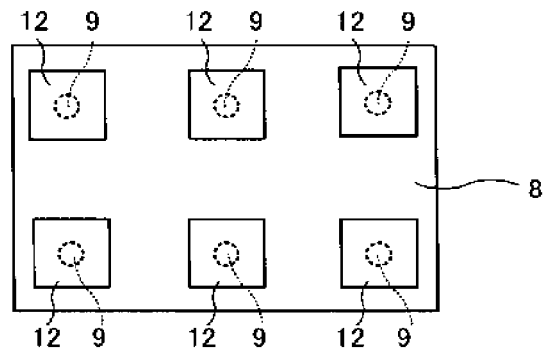

As illustrated in FIG. 2 and FIGS. 3A-3D, the mounting substrate 2 preferably has a configuration in which three ceramic layers 6, 7, and 8A-8D are laminated in this order from the top. FIG. 3A illustrates the upper surface of the ceramic layer 6, FIG. 3B illustrates the upper surface of the ceramic layer 7, FIG. 3C illustrates the upper surface of the ceramic layer 8, and FIG. 3D illustrates the lower surface of the ceramic layer 8.

A plurality of the upper surface electrodes 4 are provided on the upper surface of the ceramic layer 6. A plurality of conductive vias 9 are provided in the ceramic layer 6 while penetrating through the rear and front surfaces thereof.

Inductor electrodes E11, E21, and E31 and a plurality of internal electrodes 11 are provided on the upper surface of the ceramic layer 7. The inductor electrodes E11, E21, and E31 constitute a portion of the inductors L1, L2, and L3, respectively. Further, the plurality of conductive vias 9 are provided on the ceramic layer 7 while penetrating through the rear and front surfaces thereof.

Inductor electrodes E12, E22, and E32 and the plurality of internal electrodes 11 are provided on the upper surface of the ceramic layer 8. The inductor electrodes E12, E22, and E32 constitute a portion of the inductors L1, L2, and L3, respectively. Further, the plurality of conductive vias 9 are provided on the ceramic layer 8 while penetrating through the rear and front surfaces thereof.

A plurality of lower surface electrodes 12 are provided on the lower surface of the ceramic layer 8.

In the mounting substrate 2, the inductor electrodes E11 and E12 constitute the inductor L1, the inductor electrodes E21 and E22 constitute the inductor L2, and the inductor electrodes E31 and E32 constitute the inductor L3.

In the ladder surface acoustic wave filter 100, the respective inductance values of the inductors L1, L2, and L3 are made small, so that the lengths of the inductor electrodes E11, E12, E21, E22, E31, and E32 are small. As a result, the ladder surface acoustic wave filter 100 decrease the planar dimensions of the ceramic layers 7 and 8 so as to decrease the planar dimension of the mounting substrate 2.

In the ladder surface acoustic wave filter 100 in the present preferred embodiment, the piezoelectric substrate 1 is flip-chip-mounted on the mounting substrate 2 using the bumps made of Au or the like while the surface on which the resonators are formed faces downward. As a result, the ladder surface acoustic wave filter 100 constitutes a ladder filter circuit as illustrated in FIG. 1.

The ladder surface acoustic wave filter 100 according to the present preferred embodiment, which has the above-mentioned configuration, preferably is manufactured by the following method, for example.

First, the piezoelectric substrate 1 and the mounting substrate 2 are produced.

The piezoelectric substrate 1 is produced by preparing a wafer (not illustrated) preferably made of lithium tantalite (LiTaO3), lithium niobate (LiNbO3), or the like, first.

Next, a large number of piezoelectric substrates 1 are formed on the wafer collectively using a thin-film technology. That is to say, the series resonators S1 to S4, the parallel arm resonators P11 to P31, necessary wirings, the pad electrodes 3, and the like for the large number of piezoelectric substrates 1 are formed. A metal such as Au is preferably used for the series resonators S1 to S4, the parallel arm resonators P11 to P31, the wirings, and the pad electrodes 3.

Next, the bumps 5 made of a metal such as Au are formed on the pad electrodes 3 of the respective piezoelectric substrates 1.

Then, the individual piezoelectric substrates 1 are obtained by dividing the wafer.

The mounting substrate 2 is produced as follows. First, a plurality of ceramic green sheets (not illustrated) preferably made of a material such as an alumina-based material to be used for high-temperature sintered ceramic or a glass ceramic-based material to be used for low-temperature sintered ceramic are prepared. The green sheets are prepared as large mother green sheets such that a large number of mounting substrates 2 can be produced at a time.

Thereafter, holes for forming the conductive vias 9 are formed at predetermined positions on the respective mother green sheets using laser beams or the like. Subsequently, conductive pastes are filled into these holes. For example, a material containing Cu as a main component is used for the conductive pastes.

Then, the conductive pastes are applied to predetermined positions on the surfaces of the respective mother green sheets so as to form electrode patterns for forming the upper surface electrodes 4, the internal electrodes 11, and the lower surface electrodes 12 by a method such as screen printing. As a result, the mother green sheet for the ceramic layer 6, the mother green sheet for the ceramic layer 7, and the mother green sheet for the ceramic layer 8 are completed.

Subsequently, the mother green sheet for the ceramic layer 7 is laminated on the mother green sheet for the ceramic layer 8, and the mother green sheet for the ceramic layer 6 is laminated on the mother green sheet for the ceramic layer 7. They are pressurized so as to obtain a non-sintered mother mounting substrate.

The non-sintered mother mounting substrate is sintered with a predetermined profile so as to obtain a sintered mother mounting substrate.

The sintered mother mounting substrate is divided so as to obtain the individual mounting substrates 2.

Finally, the bumps 5 formed on the pad electrodes 3 of the piezoelectric substrate 1 are made to abut against the upper surface electrodes 4 of the mounting substrate 2. Then, the piezoelectric substrate 1 is pressurized to the mounting substrate 2, is subject to ultrasonic wave processing if necessary, and is heated if necessary, so that the bumps 5 are bonded to the upper surface electrodes 4 of the mounting substrate 2. As a result, the piezoelectric substrate 1 is mounted on the mounting substrate 2 and the ladder surface acoustic wave filter 100 in the present preferred embodiment is completed.

Examples of the configuration of the ladder surface acoustic wave filter 100 in the first preferred embodiment of the present invention and the manufacturing method thereof have been described hereinbefore. However, the present invention is not limited to the above-mentioned contents and various changes can be made based on the spirit of the present invention.

For example, in the ladder surface acoustic wave filter 100, the four series arm resonators S1 to S4 preferably are provided in the series arm SA, for example. However, the number of series arm resonators is not limited thereto and may be more than or less than four.

Further, in the ladder surface acoustic wave filter 100, in each of the parallel arms PA1 to PA3, the inductor L1 (L2 and L3) preferably is provided between the connection point between the parallel arm resonator P11 (P21 and P31) and the parallel arm resonator P12 (P22 and P32) and the ground. However, as will be seen from the following second preferred embodiment, it is sufficient that the configuration is provided in at least one parallel arm.

In the ladder surface acoustic wave filter 100, the inductors L1 to L3 are preferably provided on the mounting substrate 2. Alternatively, the inductors L1 to L3 may be prepared as separate inductor components and may be mounted on the surface of the mounting substrate 2 without creating the inductors L1 to L3 on the mounting substrate 2.

Further, in the ladder surface acoustic wave filter 100, the inductors L1 to L3 are preferably provided on the mounting substrate 2. Alternatively, a mounting package with a lid may be used instead of the mounting substrate 2 and the inductors L1 to L3 may be provided on the mounting package.

The mounting substrate is not limited to the ceramic multilayered substrate and for example, a resin-based multilayered substrate such as a glass epoxy substrate can be used.

With the following method, it is checked that the above-mentioned ladder surface acoustic wave filter 100 according to the first preferred embodiment of the present invention and the ladder surface acoustic wave filter with the existing circuit configuration have the same transmission characteristics.

First, a ladder surface acoustic wave filter 400 with the existing circuit configuration as a comparison example was manufactured.

Figure 6:
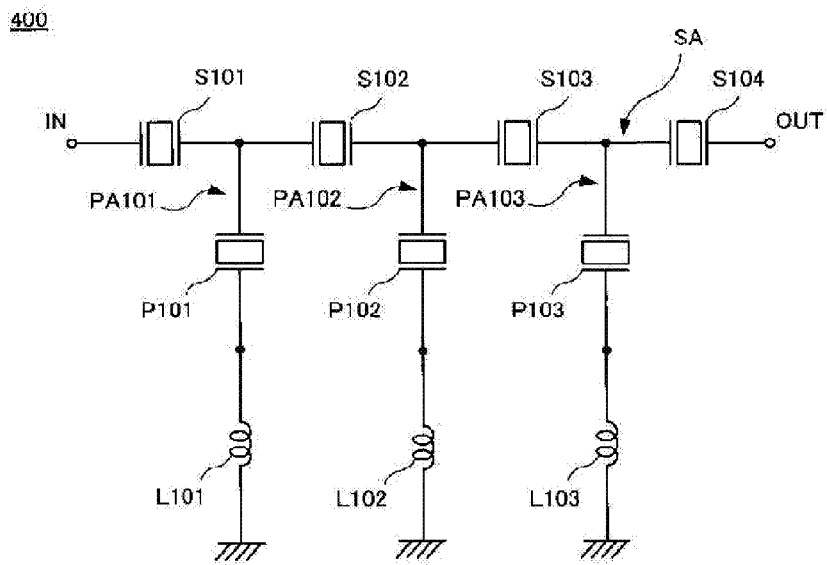
FIG. 6 is a circuit configuration diagram illustrating an existing ladder surface acoustic wave filter 400.
Figure 7:
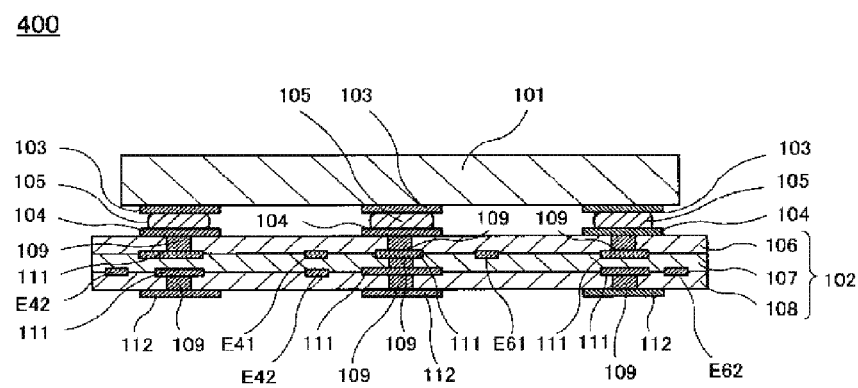
FIG. 7 is a cross-sectional view illustrating the existing ladder surface acoustic wave filter 400.

FIG. 6, FIG. 7, and FIGS. 8A-8D illustrate the ladder surface acoustic wave filter 400. FIG. 6 is a circuit configuration diagram illustrating the ladder surface acoustic wave filter 400. FIG. 7 is a cross-sectional view illustrating the ladder surface acoustic wave filter 400. FIGS. 8A-8D are exploded views illustrating a mounting substrate 102 used for the ladder surface acoustic wave filter 400.

As illustrated in FIG. 6, in the ladder surface acoustic wave filter 400, four series arm resonators S101, S102, S103, and S104 connected to one another in series are provided in a series arm SA between an input terminal IN and an output terminal OUT.

A parallel arm resonator P101 and an inductor L101 connected to each other in series are provided in a parallel arm PA101 between a connection point between the series arm resonator S101 and the series arm resonator S102 and the ground. A parallel arm resonator P102 and an inductor L102 connected to each other in series are provided in a parallel arm PA102 between a connection point between the series arm resonator S102 and the series arm resonator S103 and the ground. Further, a parallel arm resonator P103 and an inductor L103 connected to each other in series are provided in a parallel arm PA103 between a connection point between the series arm resonator S103 and the series arm resonator S104 and the ground.

The inductors L101, L102, and L103 shift resonance points to the low frequency side in the respective resonance characteristics of the parallel arm resonators P101, P102, and P103, and define sub-resonance points at the high frequency side relative to the anti-resonance points. This enlarges a pass band of the ladder surface acoustic wave filter 400 and defines an attenuation pole in a stop band at the high frequency side relative to the pass band.

The ladder surface acoustic wave filter 400 is configured by flip-chip-mounting a piezoelectric substrate 101 on the mounting substrate 102, as illustrated in FIG. 7. That is to say, the ladder surface acoustic wave filter 400 is configured by connecting pad electrodes 103 provided on the lower surface of the piezoelectric substrate 101 to upper surface electrodes 104 provided on the upper surface of the mounting substrate 102 through bumps 105.

Although not illustrated in FIG. 7, the above-mentioned series arm resonators S101, S102, S103, and S104 and parallel arm resonators P101, P102, and P103 are provided on the lower surface of the piezoelectric substrate 101 so as to be connected to one another with the above-mentioned relation. Further, predetermined places of the series arm resonators S101, S102, S103, and S104 and the parallel arm resonators P101, P102, and P103 are connected to the predetermined pad electrodes 103.

Figure 8A:
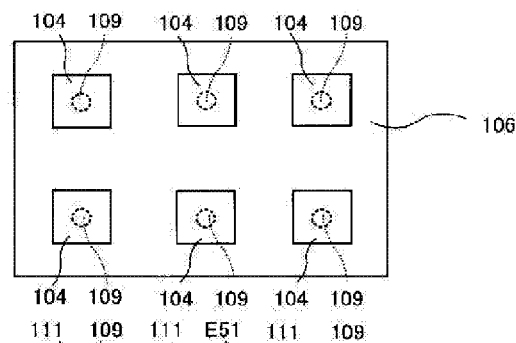
FIGS. 8A-8D are exploded views illustrating a mounting substrate 102 used for the existing ladder surface acoustic wave filter 400.
Figure 8B:
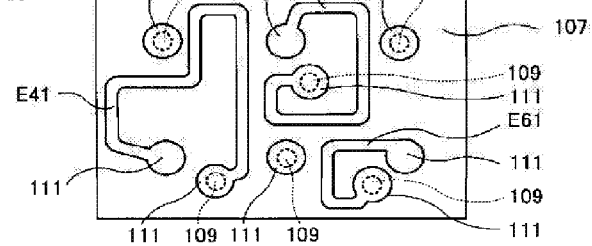
Figure 8C:
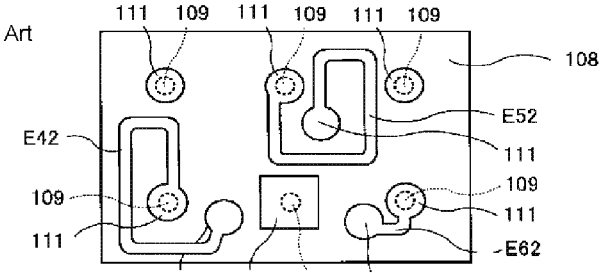
Figure 8D:
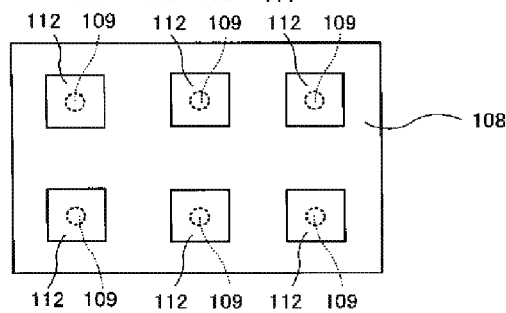

As illustrated in FIG. 7 and FIGS. 8A-8D, the mounting substrate 102 has a configuration in which three ceramic layers 106, 107, and 108 are laminated in this order from the top. FIG. 8A illustrates the upper surface of the ceramic layer 106, FIG. 8B illustrates the upper surface of the ceramic layer 107, FIG. 8C illustrates the upper surface of the ceramic layer 108, and FIG. 8D illustrates the lower surface of the ceramic layer 108.

A plurality of the upper surface electrodes 104 are provided on the upper surface of the ceramic layer 106. A plurality of conductive vias 109 are provided on the ceramic layer 106 while penetrating through the rear and front surfaces thereof.

Inductor electrodes E41, E51, and E61 and a plurality of internal electrodes 111 are provided on the upper surface of the ceramic layer 107. The inductor electrodes E41, E51, and E61 constitute a portion of the inductors L101, L102, and L103, respectively. Further, the plurality of conductive vias 109 are provided on the ceramic layer 107 while penetrating through the rear and front surfaces thereof.

Inductor electrodes E42, E52, and E62 and the plurality of internal electrodes 111 are provided on the upper surface of the ceramic layer 108. The inductor electrodes E42, E52, and E62 constitute a portion of the inductors L101, L102, and L103, respectively. Further, the plurality of conductive vias 109 are provided on the ceramic layer 108 while penetrating through the rear and front surfaces thereof.

A plurality of lower surface electrodes 112 are provided on the lower surface of the ceramic layer 108.

On the mounting substrate 102, the inductor electrodes E41 and E42 constitute the inductor L101, the inductor electrodes E51 and E52 constitute the inductor L102, and the inductor electrodes E61 and E62 constitute the inductor L103. The ladder surface acoustic wave filter 400 constitutes the circuit configuration diagram as illustrated in FIG. 6 by mounting the piezoelectric substrate 101 on the mounting substrate 102 having the above-mentioned configuration.

Next, the ladder surface acoustic wave filter 100 according to the first preferred embodiment of the present invention and the ladder surface acoustic wave filter 400 in the comparison example are compared with each other.

The four series arm resonators S1, S2, S3, and S4 and the six parallel arm resonators P11, P12, P21, P22, P31, and P32 are provided on the piezoelectric substrate 1 of the ladder surface acoustic wave filter 100. On the other hand, four series arm resonators S101, S102, S103, and S104 and three parallel arm resonators P101, P102, and P103 are provided on the piezoelectric substrate 101 of the ladder surface acoustic wave filter 400. That is to say, the number of resonators and circuit arrangements provided on the piezoelectric substrate 1 and the piezoelectric substrate 101 are different from each other.

However, both of the planar dimension of the piezoelectric substrate 1 and the planar dimension of the piezoelectric substrate 101 are, for example, 0.8 mm×1.4 mm and equal to each other. As described above, the piezoelectric substrate 1 has a sufficient space for providing the resonators. Therefore, the planar dimension of the piezoelectric substrate 1 can be kept to be the same as that of the piezoelectric substrate 101 although the number of resonators is increased.

In contrast, the planar dimension of the mounting substrate 2 of the ladder surface acoustic wave filter 100 is, for example, 1.6 mm×1.2 mm whereas the planar dimension of the mounting substrate 102 of the ladder surface acoustic wave filter 400 is, for example, 2.0 mm×1.2 mm. That is to say, the mounting substrate 2 is smaller than the mounting substrate 102. The planar area of the mounting substrate 2 is approximately 80% of the planar area of the mounting substrate 102.

In the ladder surface acoustic wave filter 100, the planar dimension of the mounting substrate 2 can be made smaller than the planar dimension of the mounting substrate 102 for the following reason. That is to say, first, the inductance value of the inductor L1 of the ladder surface acoustic wave filter 100 can be made smaller than the inductance value of the inductor L101 of the ladder surface acoustic wave filter 400, so that the lengths of the inductor electrodes E11 and E12 constituting the inductor L1 on the mounting substrate 2 can be made smaller than the lengths of the inductor electrodes E41 and E42 constituting the inductor L101 on the mounting substrate 102. In addition, the inductance value of the inductor L2 can be made smaller than the inductance value of the inductor L102, so that the lengths of the inductor electrodes E21 and E22 constituting the inductor L2 on the mounting substrate 2 can be made smaller than the lengths of the inductor electrodes E51 and E52 constituting the inductor L102 on the mounting substrate 102. Further, the inductance value of the inductor L3 can be made smaller than the inductance value of the inductor L103, so that the lengths of the inductor electrodes E31 and E32 constituting the inductor L3 on the mounting substrate 2 can be made smaller than the lengths of the inductor electrodes E61 and E62 constituting the inductor L103 on the mounting substrate 102.

That is to say, in the ladder surface acoustic wave filter 400, as illustrated in FIGS. 8B and 8C, the respective inductor electrodes E41, E42, E51, E52, E61, and E62 need to have equal to or larger than certain lengths, so that the ceramic layers 107 and 108 cannot be reduced in size. In contrast, in the ladder surface acoustic wave filter 100, as illustrated in FIGS. 3B and 3C, the lengths of the inductor electrodes E11, E12, E21, E22, E31, and E32 can be made small and the ceramic layers 7 and 8 can be reduced in size in comparison with the case of the ladder surface acoustic wave filter 400. This reduces the size of the mounting substrate 2.

When the mounting substrate or the mounting package on which the inductors have been provided is reduced in size, the upper surface electrodes (electrodes provided to mount the piezoelectric substrate on which the resonators have been formed) themselves provided on the upper surface of the mounting substrate or the mounting package can be reduced in size or an interval between the upper surface electrodes can be made smaller. This enables the piezoelectric substrate on which the resonators have been provided, which is mounted thereon the upper surface electrodes, to be reduced in size.

At least two parallel arm resonators connected to each other in series are preferably provided in the parallel arm in the first preferred embodiment, so that the number of parallel arm resonators is increased in comparison with that in the existing method.

However, in the ladder surface acoustic wave filter, the plurality of resonators are provided on the single piezoelectric substrate generally and there is a sufficient space to provide the resonators on the piezoelectric substrate in many cases. Therefore, increase in the number of resonators generally does not cause the piezoelectric substrate to be increased in size.

That is to say, according to the first preferred embodiment of the present invention, the mounting substrate or the mounting package is reduced in size or the inductor components to be mounted are reduced in size without increasing the piezoelectric substrate in size, thus enabling the ladder surface acoustic wave filter to be reduced in size.

Next, the transmission characteristics of the ladder surface acoustic wave filter 100 in the first preferred embodiment of the present invention and the transmission characteristics of the ladder surface acoustic wave filter 400 in the comparison example are compared.

Figure 9:
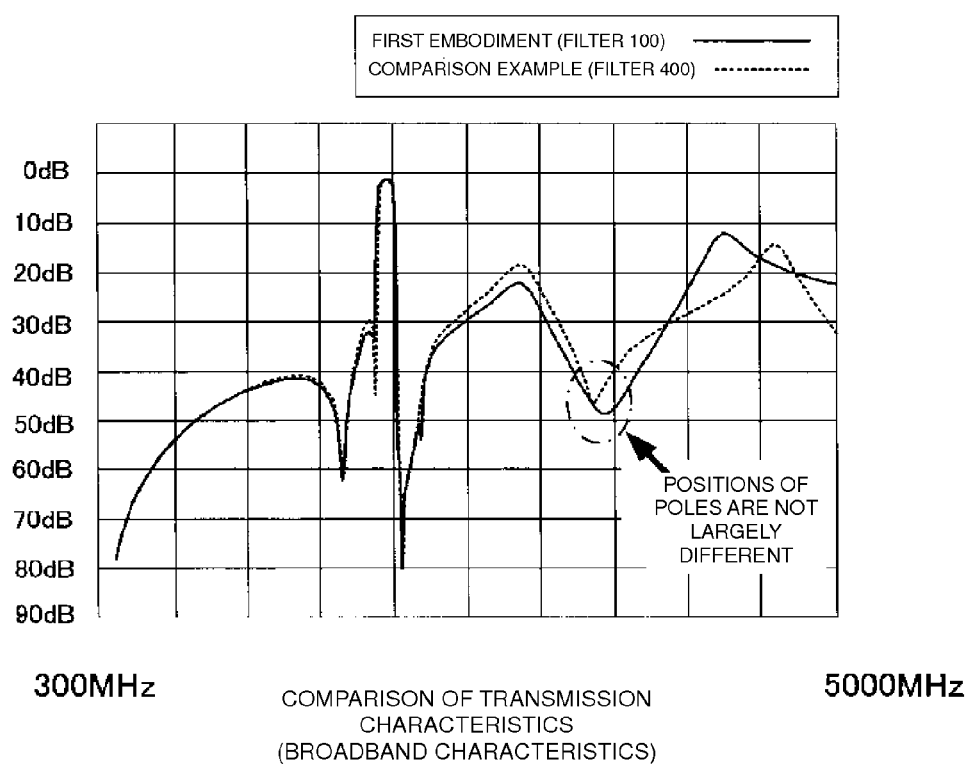
FIG. 9 is a graph illustrating broadband transmission characteristics of the ladder surface acoustic wave filter 100 in the first preferred embodiment of the present invention and the existing ladder surface acoustic wave filter 400.
Figure 10:
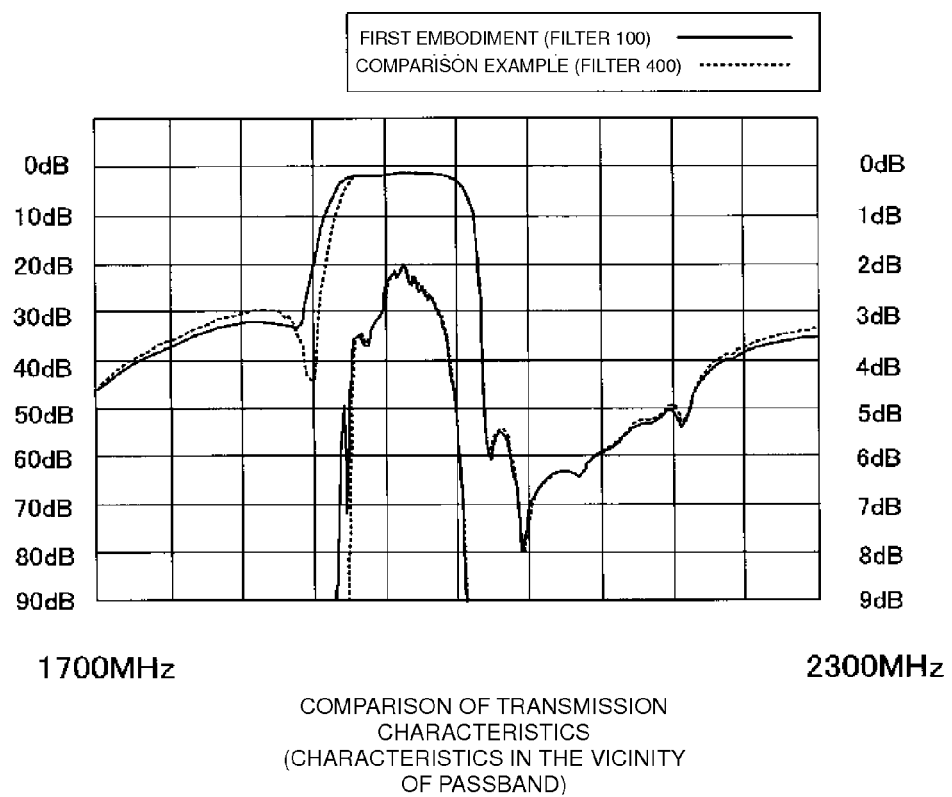
FIG. 10 is a graph illustrating transmission characteristics in the vicinity of pass bands of the ladder surface acoustic wave filter 100 in the first preferred embodiment of the present invention and the existing ladder surface acoustic wave filter 400.

FIG. 9 illustrates broadband transmission characteristics of the ladder surface acoustic wave filter 100 and the ladder surface acoustic wave filter 400. FIG. 10 illustrates transmission characteristics in the vicinity of pass bands of the ladder surface acoustic wave filter 100 and the ladder surface acoustic wave filter 400.

As is seen from FIG. 9 and FIG. 10, the transmission characteristics of the ladder surface acoustic wave filter 100 and the ladder surface acoustic wave filter 400 are substantially equivalent. As is seen from FIG. 9, in both the transmission characteristics of the ladder surface acoustic wave filter 100 and the ladder surface acoustic wave filter 400, attenuation poles are located in stop bands at the high frequency side relative to the pass bands and the frequencies of them are substantially the same.

In the ladder surface acoustic wave filter in the first preferred embodiment, when the inductors are reduced in size without changing the size of the mounting substrate or the mounting package on which the inductors have been formed, the distance between the inductors is larger in the mounting substrate or the mounting package, thus improving isolation between them. In this case, the ladder surface acoustic wave filter in the first preferred embodiment provide more excellent transmission characteristics than the transmission characteristics in the existing ladder surface acoustic wave filter.

Further, in the ladder surface acoustic wave filter in the first preferred embodiment, the sub-resonance point of the parallel arm resonators can be moved to the lower frequency side without changing the inductance values of the inductors, changing the sizes of the inductors, or changing the size of the mounting substrate or the mounting package on which the inductors have been formed. That is to say, the first preferred embodiment can be used for obtaining desired transmission characteristics of the ladder surface acoustic wave filter.

As described above, it was discovered that the ladder surface acoustic wave filter 100 in the first preferred embodiment of the present invention is reduced in size while including the desired transmission characteristics or provide the desired transmission characteristics without changing the size of the ladder surface acoustic wave filter 100.

Second Preferred Embodiment

Figure 11:
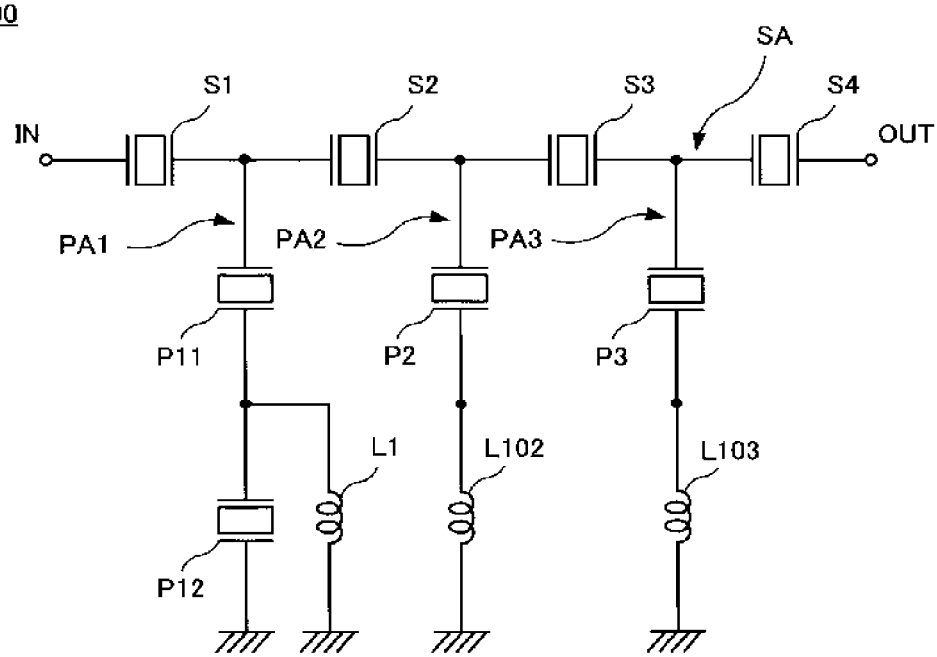
FIG. 11 is a circuit configuration diagram illustrating a ladder surface acoustic wave filter 200 according to a second preferred embodiment of the present invention.

FIG. 11 illustrates a ladder surface acoustic wave filter 200 according to a second preferred embodiment of the present invention. FIG. 11 is a circuit configuration diagram of the ladder surface acoustic wave filter 200.

In the ladder surface acoustic wave filter 200, the parallel arm resonator P11 and the parallel arm resonator P12 connected to each other in series are provided in the parallel arm PA1 only and the inductor L1 is provided between the connection point between the parallel arm resonator P11 and the parallel arm resonator P12 and the ground. The parallel arms PA2 and PA3 have the existing configurations. That is to say, for example, one parallel arm resonator P2 is provided in the parallel arm PA2, and the inductor L102 is provided between the parallel arm resonator P2 and the ground.

In various preferred embodiments of the present invention, it is sufficient that at least one parallel arm has the characteristic configuration of the present invention. In this case, it is preferable that the parallel arm inhibiting the size reduction of the mounting substrate or the mounting package because the inductance value of the inductor is large and the inductor electrode is long have the characteristic configuration of various preferred embodiments of the present invention.

Third Preferred Embodiment

Figure 12:
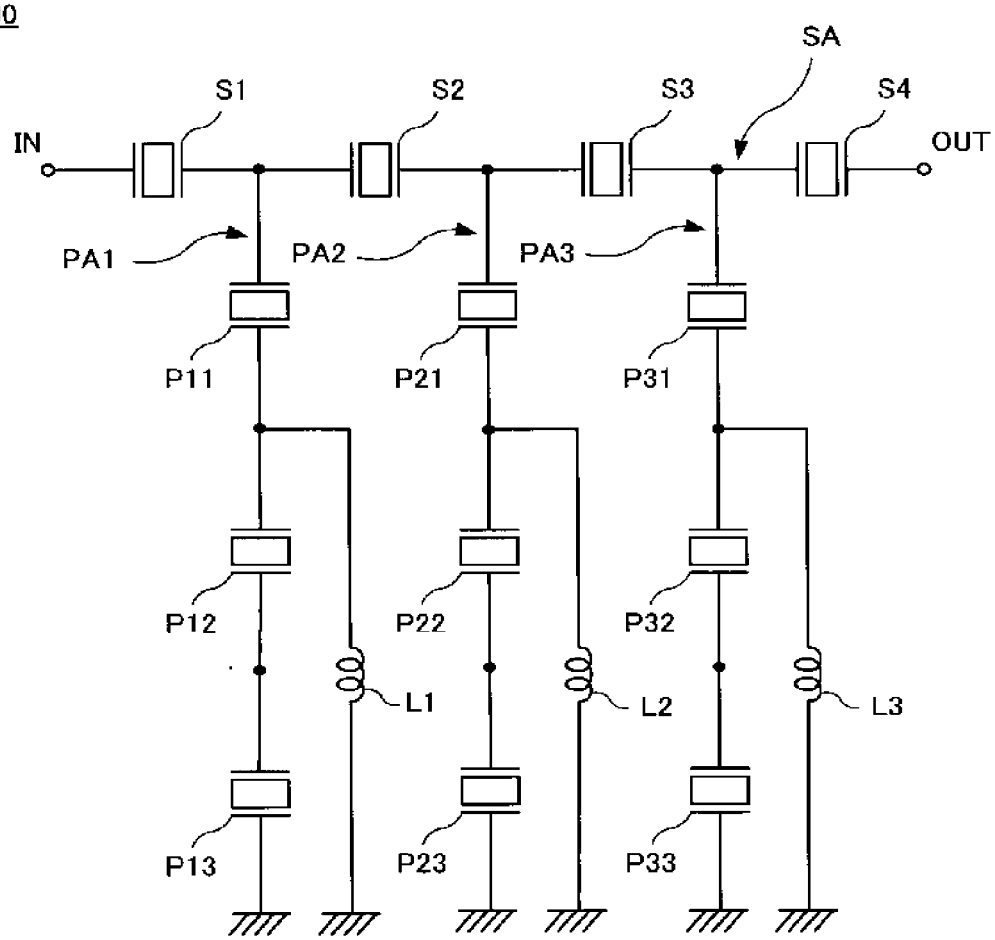
FIG. 12 is a circuit configuration diagram illustrating a ladder surface acoustic wave filter 300 according to a third preferred embodiment of the present invention.

FIG. 12 illustrates a ladder surface acoustic wave filter 300 according to a third preferred embodiment of the present invention. FIG. 12 is a circuit configuration diagram of the ladder surface acoustic wave filter 300.

In the ladder surface acoustic wave filter 300, three sets of three parallel arm resonators connected to one another in series preferably are provided in the parallel arms PA1 to PA3, respectively, and inductors are provided between connection points between two parallel arm resonators at the side closer to the series arm SA and the ground. For example, the three parallel arm resonators P11, P12, and P13 connected to one another in series are provided in the parallel arm PA1 and the inductor L1 is provided between a connection point between the parallel arm resonator P11 and the parallel arm resonator P12 and the ground.

In this manner, it is sufficient that the number of parallel arm resonators connected to one another in series, which are provided in the parallel arm having the characteristic configurations of various preferred embodiments of the present invention, is equal to or more than two. The number of parallel arm resonators may be three as in the case of the ladder surface acoustic wave filter 300 or more than three. Further, in such cases, the inductor may be provided between the connection point between any parallel arm resonator and any parallel arm resonator and the ground. For example, in the case of the parallel arm PA1, the inductor L1 may be provided between the connection point between the parallel arm resonator P12 and the parallel arm resonator P13 and the ground without being provided between the connection point between the parallel arm resonator P11 and the parallel arm resonator P12 and the ground.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ladder surface acoustic wave filter comprising:
an inductor:
a series arm connecting an input terminal and an output terminal;
at least one first parallel arm connecting the series arm and a ground terminal;
at least one series arm resonator provided in the series arm; and
at least two parallel arm resonators provided in at least one second parallel arm and connected to each other in series; wherein
at least one connection point between the two parallel arm resonators connected to each other in series is grounded through the inductor; and
the inductor is configured to shift a resonance point of resonation by the at least two parallel arm resonators of the at least one second parallel arm to a low frequency side and defines a sub-resonance point at a high frequency side relative to an anti-resonance point of the at least two parallel arm resonators of the at least one second parallel arm.

2. The ladder surface acoustic wave filter according to claim 1, wherein
the at least one series arm resonator and the at least two parallel arm resonators are located on a single piezoelectric substrate;
the inductor is located on a mounting substrate or a mounting package; and
the piezoelectric substrate is mounted on the mounting substrate or the mounting package.

3. The ladder surface acoustic wave filter according to claim 1, wherein the at least one series arm resonator includes four series arm resonators.

4. The ladder surface acoustic wave filter according to claim 1, wherein the at least one first parallel arm includes at least two parallel arm resonators connected to each other in series.

5. The ladder surface acoustic wave filter according to claim 4, further comprising another inductor provided between a connection point between the at least two parallel arm resonators of the at least one first parallel arm and the ground terminal.

6. The ladder surface acoustic wave filter according to claim 5, wherein the another inductor is configured to shift a resonance point of resonation by the at least two parallel arm resonators of the at least one first parallel arm to a low frequency side and defines a sub-resonance point at a high frequency side relative to an anti-resonance point of the at least two parallel arm resonators of the at least one first parallel arm.

7. The ladder surface acoustic wave filter according to claim 1, further comprising at least one third parallel arm connecting the series arm and the ground terminal.

8. The ladder surface acoustic wave filter according to claim 7, wherein the at least one third parallel arm includes at least two parallel arm resonators connected to each other in series.

9. The ladder surface acoustic wave filter according to claim 8, further comprising another inductor provided between a connection point between the at least the two parallel resonators of the at least one third parallel arm and the ground terminal.

10. The ladder surface acoustic wave filter according to claim 9, wherein the another inductor is configured to shift a resonance point of resonation by the at least two parallel arm resonators of the at least one third parallel arm to a low frequency side and defines a sub-resonance point at a high frequency side relative to an anti-resonance point of the at least two parallel arm resonators of the at least one third parallel arm.

11. The ladder surface acoustic wave filter according to claim 2, further comprising at least one third parallel arm connecting the series arm and the ground terminal, wherein each of the at least one first parallel arm, the at least one second parallel arm, and the at least one third parallel arm includes a set of at least three parallel arm resonators connected to one another in series.

12. The ladder surface acoustic wave filter according to claim 11, wherein each of the at least one first parallel arm, the at least one second parallel arm, and the at least one third parallel arm comprises a respective inductor connected between respective pairs of the parallel arm resonators connected in series among the respective set of at least three parallel arm resonators connected in series.

* * * * *